United States Patent
Dussinger et al.

(10) Patent No.: US 12,531,409 B2
(45) Date of Patent: Jan. 20, 2026

(54) APPARATUS, SYSTEM, AND METHOD FOR REDUCING THE FOOTPRINTS OF CIRCUITS THAT PROTECT AGAINST THE ANTENNA EFFECT AND ELECTROSTATIC DISCHARGE

(71) Applicant: Advanced Micro Devices, Inc., Santa Clara, CA (US)

(72) Inventors: Stephen Dussinger, Ft. Collins, CO (US); William E. Laub, Jr., Boxborough, MA (US); John Wuu, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 140 days.

(21) Appl. No.: 18/520,235

(22) Filed: Nov. 27, 2023

(65) Prior Publication Data

US 2025/0174985 A1 May 29, 2025

(51) Int. Cl.
*H02H 9/04* (2006.01)
*H01Q 1/50* (2006.01)

(52) U.S. Cl.
CPC .............. *H02H 9/046* (2013.01); *H01Q 1/50* (2013.01)

(58) Field of Classification Search
CPC ................................. H02H 9/046; H01Q 1/50
USPC ............................................................. 361/56
See application file for complete search history.

(56) References Cited

U.S. PATENT DOCUMENTS

| | | | |
|---|---|---|---|
| 12,259,430 B1 * | 3/2025 | Patra | H05K 1/029 |
| 12,327,790 B2 * | 6/2025 | Lee | H01L 23/53204 |
| 2021/0305678 A1 * | 9/2021 | Huang | H01L 25/16 |
| 2023/0095608 A1 * | 3/2023 | Elsherbini | H10D 84/01 |
| | | | 29/825 |
| 2023/0176953 A1 * | 6/2023 | Kim | G11C 5/025 |
| | | | 326/10 |
| 2023/0411390 A1 * | 12/2023 | O'Brien | H01L 23/5226 |
| 2024/0332193 A1 * | 10/2024 | Wang | H01L 23/49838 |
| 2024/0395993 A1 * | 11/2024 | Yang | G09G 3/3233 |
| 2025/0006651 A1 * | 1/2025 | Karhade | H01L 24/81 |
| 2025/0044533 A1 * | 2/2025 | Brun | G02B 6/30 |

* cited by examiner

*Primary Examiner* — Dharti H Patel
(74) *Attorney, Agent, or Firm* — Greenberg Traurig, LLP

(57) ABSTRACT

An exemplary apparatus includes a through-silicon via (TSV) and circuit that protects against the antenna effect and electrostatic discharge (ESD). The circuit can include a plurality of transistors whose gates are each electrically coupled to a signal that passes through the TSV. Various other apparatuses, systems, and methods are also disclosed.

20 Claims, 5 Drawing Sheets

APPARATUS, SYSTEM, AND METHOD FOR REDUCING THE FOOTPRINTS OF CIRCUITS THAT PROTECT AGAINST THE ANTENNA EFFECT AND ELECTROSTATIC DISCHARGE

BACKGROUND

Some semiconductor devices can implement and/or incorporate through-silicon vias (TSVs) that pass signals through or across certain dies. For example, a semiconductor device can include a die through which a TSV passes a digital signal to a receiver. In this example, the signal can be susceptible to the antenna effect and electrostatic discharge (ESD). To mitigate this susceptibility, the semiconductor device can implement one circuit designed to protect against the antenna effect and another circuit designed to protect against ESD. Unfortunately, because these separate circuits are often replicated numerous times throughout the semiconductor device, such circuits can collectively consume a significant amount of space and/or real estate across the semiconductor device. As a result, such circuits can undermine efforts to reduce the package size of the semiconductor device.

The instant disclosure, therefore, identifies and addresses a need for apparatuses, systems, and methods that facilitate and/or support reducing the footprints of circuits that protect against the antenna effect and ESD.

BRIEF DESCRIPTION OF THE DRAWINGS

The accompanying drawings illustrate a number of exemplary implementations and are a part of the specification. Together with the following description, these drawings demonstrate and explain various principles of the instant disclosure.

Figure 1:
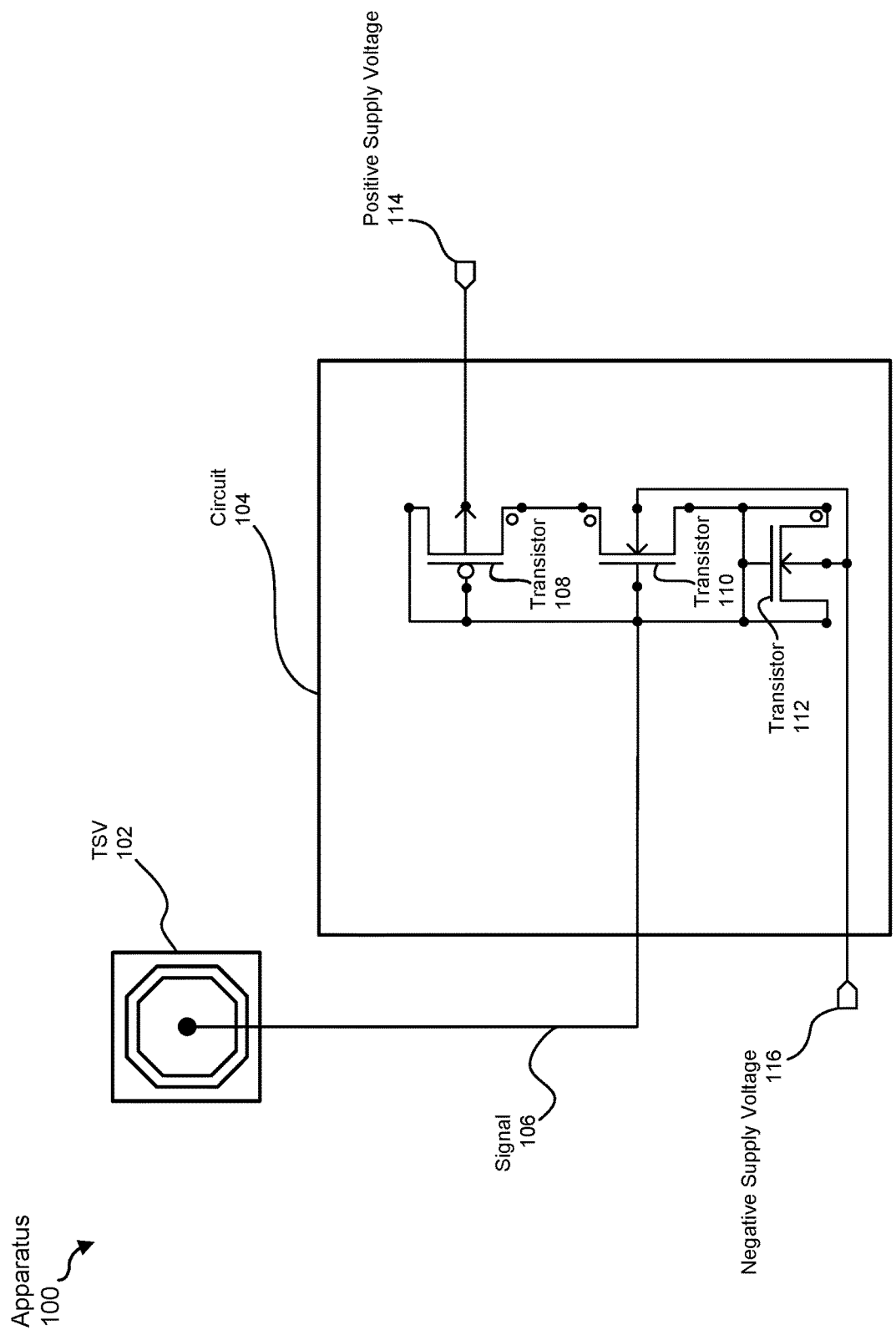
FIG. 1 is an illustration of an exemplary apparatus that reduces the footprints of circuits that protect against the antenna effect and ESD according to one or more implementations of this disclosure.

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the instant disclosure covers all modifications, equivalents, and alternatives falling within the scope of the appended claims.

DETAILED DESCRIPTION OF EXEMPLARY IMPLEMENTATIONS

The present disclosure describes various apparatuses, systems, and methods for reducing the footprints of circuits that protect against the antenna effect and ESD. In some examples, the term "antenna effect," which is sometimes referred to as plasma-induced gate oxide damage, can include and/or represent a potentially harmful phenomenon that occurs during the manufacture of certain semiconductor devices. For example, in the antenna effect, charge can build up and/or accumulate as conductors (e.g., copper wires and/or traces) are deposited and/or etched onto a die. In this example, if those conductors are connected to the gate of a transistor after such charge builds up and/or accumulates, the charge can pass to and/or release onto the gate of the transistor, thereby potentially breaking down the gate oxide and/or dielectric material and impairing the functionality of the transistor.

In some examples, the term "ESD" can include and/or represent a potentially harmful phenomenon in which electric current suddenly flows between electrically charged objects as a result of a short, dielectric breakdown, and/or certain types of contact. In certain VLSI devices, each signal that electrically couples a TSV to the gate of a transistor needs to be protected against both the antenna effect and ESD. Traditionally, such VLSI devices implemented one circuit designed to protect against the antenna effect and another circuit designed to protect against ESD, and these separate circuits were replicated numerous times throughout the VLSI devices. However, the collective footprints of these separate circuits can consume a significant amount of space and/or real estate across the VLSI devices.

To combat the consumption of such significant space and/or real estate, these separate circuits can be consolidated into a single circuit with a smaller footprint that fits within a standard cell of the VLSI design. As a result of the smaller footprint, this single circuit can provide the same protection against the antenna effect and/or ESD without consuming as much space and/or real estate. Moreover, because this single protective circuit can be replicated numerous times throughout a semiconductor device, this single protective circuit's overall footprint can collectively impact the size of the semiconductor device far less than traditional instances of separate antenna-effect and ESD circuits. Accordingly, this single protective circuit can help reduce the package-size requirements of the semiconductor device.

The following will provide, with reference to FIGS. 1-4, detailed descriptions of exemplary apparatuses, systems, and/or corresponding implementations for reducing the footprints of circuits that protect against the antenna effect and ESD. Detailed descriptions of an exemplary method for reducing the footprints of circuits that protect against the antenna effect and ESD will be provided in connection with FIG. 5.

FIG. 1 illustrates an exemplary apparatus 100 that facilitates and/or supports reducing the footprints of circuits that protect against the antenna effect and ESD. As illustrated in FIG. 1, exemplary apparatus 100 can include and/or represent a TSV 102 and a circuit 104 that are electrically coupled by a signal 106. In some examples, circuit 104 can be configured, arranged, and/or designed to protect against the antenna effect and ESD. For example, although not explicitly illustrated in this way in FIG. 1, signal 106 can also be electrically coupled to another circuit that includes and/or represents one or more components and/or features (e.g., transistors) that are susceptible to the antenna effect and/or ESD. In this example, circuit 104 can protect against and/or mitigate the antenna effect and ESD in connection with those components and/or features included in that other circuit.

In some examples, circuit 104 can include and/or represent a plurality of transistors whose gates are each electrically coupled to signal 106, which passes through TSV 102. In one example, circuit 104 can include and/or represent a transistor 108, a transistor 110, and/or a transistor 112. In this example, the gates of each of transistors 108, 110, and 112 can be electrically coupled to signal 106.

In some examples, one or more additional terminals of transistors 108, 110, and 112 can also be electrically coupled to signal 106. For example, the gate, drain, and source of each of transistors 108, 110, and 112 can all be electrically coupled to signal 106. In one example, the bulk (sometimes also referred to as the body connection) of transistor 108 can be electrically coupled to a positive supply voltage 114 (e.g., $V_{DD}$). Additionally or alternatively, the bulks of transistors 110 and 112 can be electrically coupled to a negative supply voltage 116 (e.g., $V_{SS}$) and/or an electrical ground.

In some examples, TSV 102 can include and/or represent an electrical connection that passes and/or penetrates through a semiconductor (e.g., silicon) wafer or die. In one example, TSV 102 can include and/or represent a via-first TSV, a via-middle TSV, and/or a via-last TSV. In one example, TSV 102 can be incorporated in and/or applied to one or more dies included in a three-dimensional (3D) integrated circuit and/or a die stack.

In some examples, transistors 108, 110, and/or 112 can each include and/or represent a field-effect transistor (FET) and/or a metal-oxide-semiconductor FET (MOSFET). For example, transistors 110 and/or 112 can each include and/or represent an n-type or n-channel MOSFET whose source, drain, and gate are all electrically coupled to signal 106 and whose bulk is electrically coupled to negative supply voltage 116 and/or electrical ground. Additionally or alternatively, transistor 108 can include and/or represent a p-type or p-channel MOSFET whose source, drain, and gate are electrically coupled to signal 106 and whose bulk is electrically coupled to positive supply voltage 114.

In some examples, signal 106 can include and/or represent electrically conductive traces, paths, and/or connections that carry analog and/or digital data across circuit 104 and/or TSV 102. In one example, signal 106 can each include and/or represent any type or form of electrically conductive material. Examples of such electrically conductive material include, without limitation, copper, aluminum, silver, gold, alloys of one or more of the same, combinations or variations of one or more of the same, and/or any other suitable materials.

Figure 2:
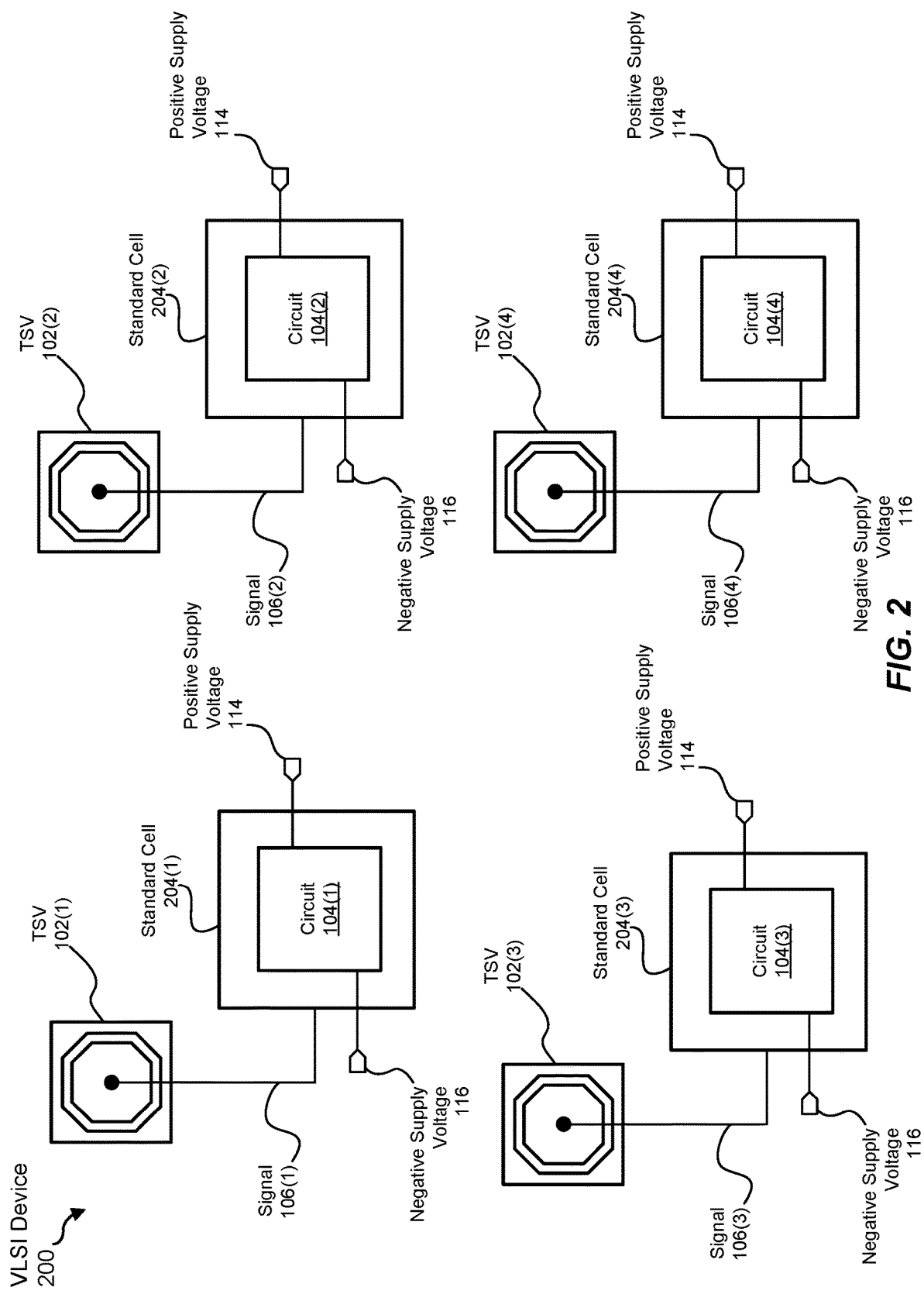
FIG. 2 is an illustration of an exemplary very large scale integration (VLSI) device that reduces the footprints of circuits that protect against the antenna effect and ESD according to one or more implementations of this disclosure.

FIG. 2 illustrates an exemplary VLSI device 200 for reducing the footprints of circuits that protect against the antenna effect and ESD. In some examples, VLSI device 200 can include and/or represent certain components and/or features that perform and/or provide functionalities that are similar and/or identical to those described above in connection with FIG. 1. As illustrated in FIG. 2, VLSI device 200 can include and/or represent various instances of apparatus 100. For example, VLSI device 200 can include and/or represent TSVs 102(1), 102(2), 102(3), and 102(4) and circuits 104(1), 104(2), 104(3), and 104(4) that are electrically coupled by signals 106(1), 106(2), 106(3), and 106(4), respectively.

In some examples, circuits 104(1)-(4) can each include and/or represent a plurality of transistors whose gates are electrically coupled to signal 106(1)-(4), respectively. In one example, signals 106(1)-(4) can pass through and/or traverse TSVs 102(1)-(4), respectively. In this example, circuits 104(1)-(4) can each include and/or represent an instance of transistor 108, transistor 110, and/or transistor 112 electrically coupled to one of signals 106(1)-(4).

In some examples, VLSI device 200 can include and/or represent standard cells 204(1), 204(2), 204(3), and 204(4) that share one or more dimensions in common with one another. In one example, the term "standard cells" can refer to predefined spatial building blocks used by engineers and/or designers in VLSI and/or application-specific integrated circuit (ASIC) design. For example, standard cells 204(1)-(4) can include and/or represent spatial allocations of equal or fixed heights, widths, and/or lengths within a VLSI and/or ASIC design. In this example, standard cells 204(1)-(4) can be highly reusable, replicable, and/or reproducible. Additionally or alternatively, standard cells 204(1)-(4) can facilitate and/or support saving time in connection with designing the VLSI and/or ASIC layout of a semiconductor device.

In some examples, VLSI device 200 can include and/or represent one or more hardware-implemented processors, compute modules, and/or integrated circuits. Additionally or alternatively, VLSI device 200 can include and/or represent any type or form of circuitry that processes, converts, and/or transforms input, data, or signals in one way or another. In one example, VLSI device 200 can include and/or represent multiple circuits distributed across one or more semiconductor dies and/or throughout a larger computing system. Examples of VLSI device 200 include, without limitation, physical processors, central processing units (CPUs), microprocessors, microcontrollers, field-programmable gate arrays (FPGAs), ASICs, systems on chips (SoCs), parallel accelerated processors, tensor cores, integrated circuits, chiplets, portions of one or more of the same, variations or combinations of one or more of the same, and/or any other suitable VLSI device.

In some examples, circuits 104(1)-(4) can fit inside standard cells 204(1)-(4), respectively, in VLSI device 200. In one example, circuits 104(1)-(4) can be positioned, located, and/or disposed inside standard cells 204(1)-(4), respectively, in VLSI device 200. In this way, circuits 104(1)-(4) can be reproduced in standard cells 204(1)-(4), respectively, for the purpose of protecting against the antenna effect and/or ESD in connection with other components of VLSI device 200.

Figure 3:
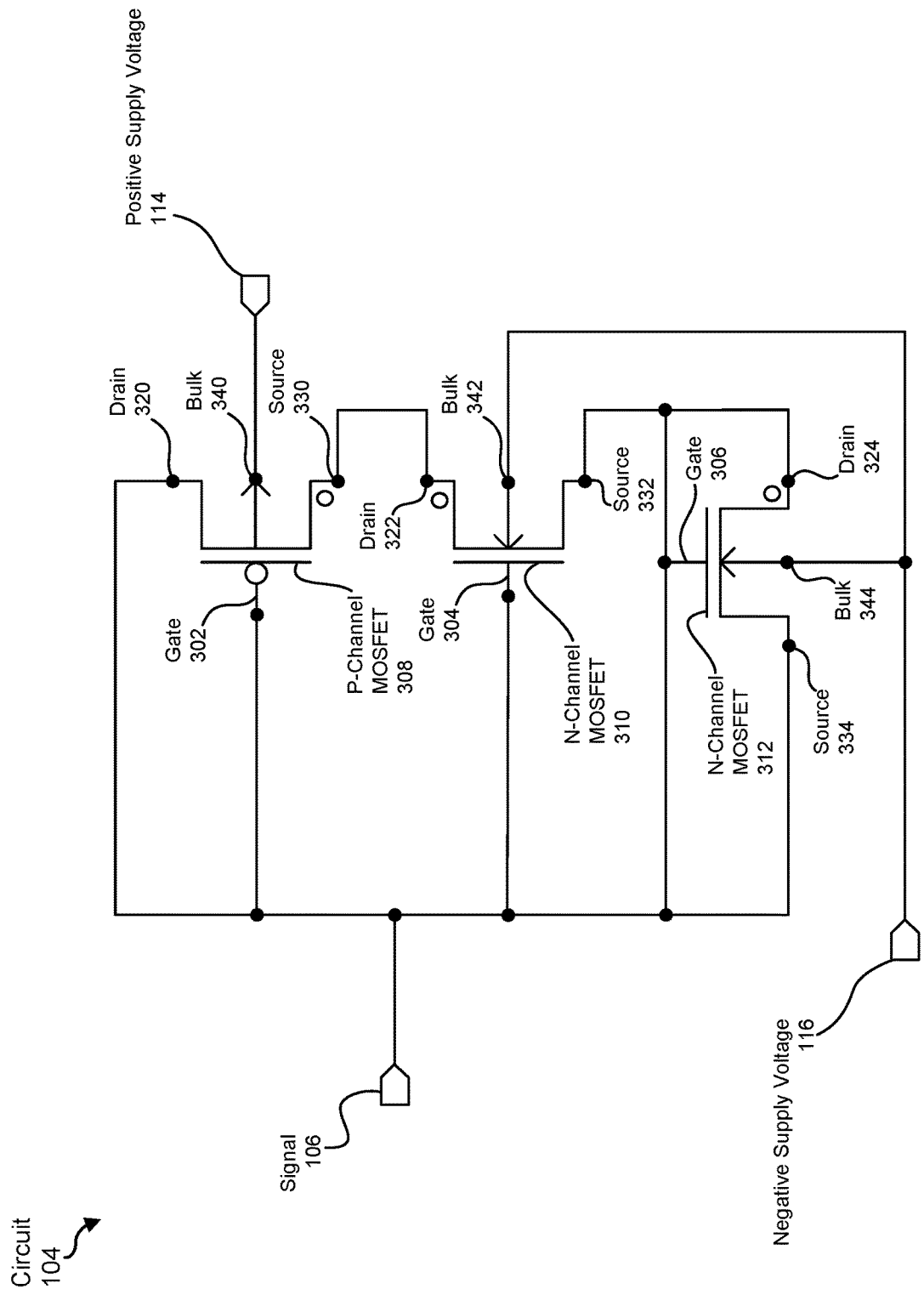
FIG. 3 is an illustration of an exemplary circuit that protects against the antenna effect and ESD according to one or more implementations of this disclosure.

FIG. 3 illustrates an exemplary implementation of circuit 104, which protects against the antenna effect and ESD. In some examples, circuit 104 can include and/or represent certain components and/or features that perform and/or provide functionalities that are similar and/or identical to those described above in connection with either FIG. 1 or FIG. 2. As illustrated in FIG. 3, circuit 104 can include and/or represent a p-channel MOSFET 308, an n-channel MOSFET 310, and/or an n-channel MOSFET 312.

In one example, signal 106 can be electrically coupled to a gate 302, a drain 320, and a source 330 of p-channel MOSFET 308. In this example, signal 106 can also be electrically coupled to a gate 304, a drain 322, and a source 332 of n-channel MOSFET 310. Additionally or alternatively, signal 106 can be electrically coupled to a gate 306, a drain 324, and a source 334 of n-channel MOSFET 312.

In one example, positive supply voltage 114 can be electrically coupled to a bulk 340 of p-channel MOSFET

308. In this example, negative supply voltage 116 can be electrically coupled to a bulk 342 of n-channel MOSFET 310. Additionally or alternatively, negative supply voltage 116 can be electrically coupled to a bulk 344 of n-channel MOSFET 312.

Figure 4:
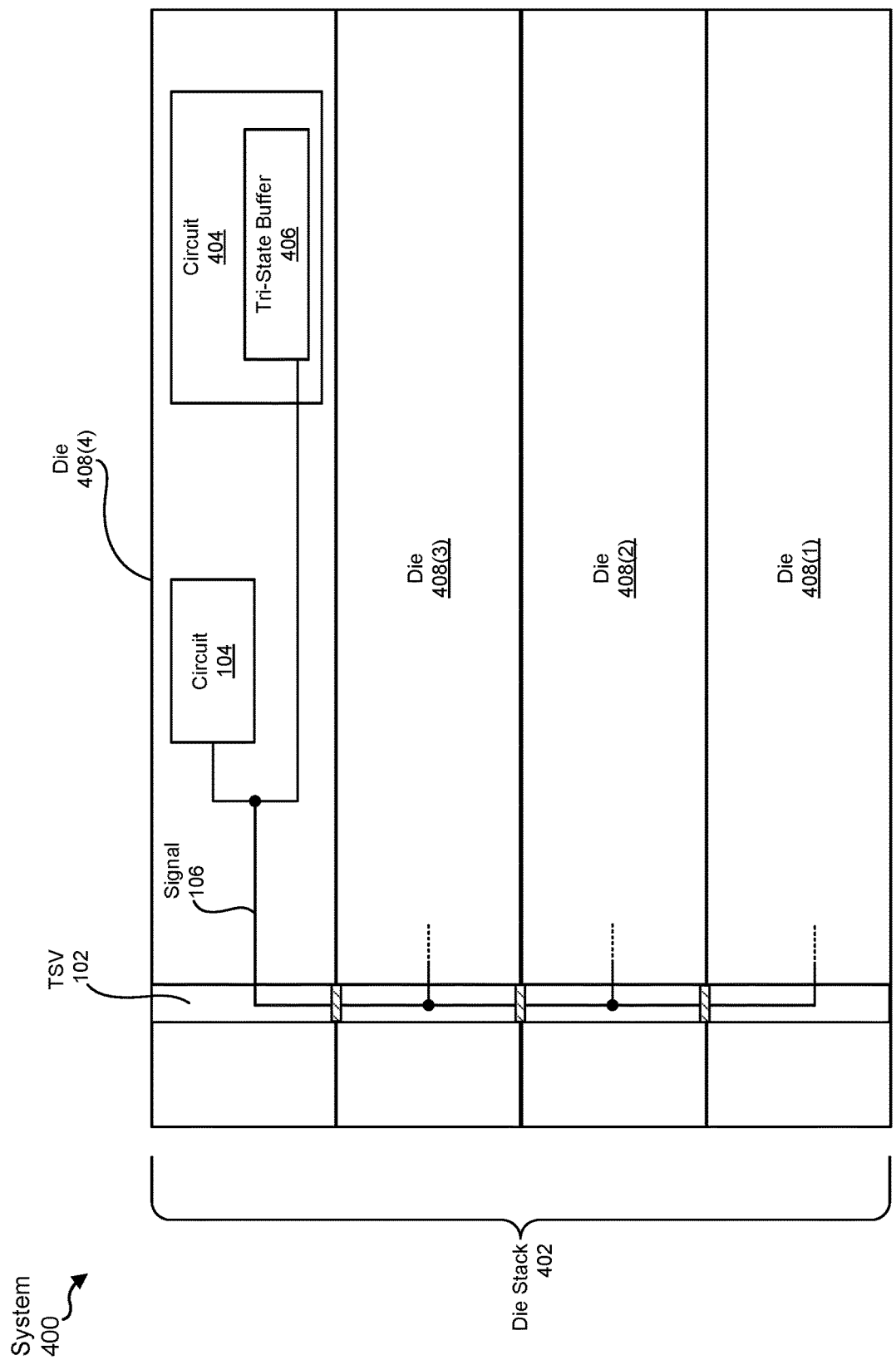
FIG. 4 is an illustration of an exemplary system that reduces the footprints of circuits that protect against the antenna effect and ESD according to one or more implementations of this disclosure.

FIG. 4 illustrates an exemplary system 400 for reducing the footprints of circuits that protect against the antenna effect and ESD. In some examples, system 400 can include and/or represent certain components and/or features that perform and/or provide functionalities that are similar and/or identical to those described above in connection with any of FIGS. 1-3. As illustrated in FIG. 4, system 400 can include and/or represent a die stack 402. In one example, die stack 402 can include and/or represent dies 408(1), 408(2), 408(3), and 408(4).

In some examples, die stack 402 can include and/or represent a compilation and/or assortment of dies that are stacked on top of one another and/or physically or electrically coupled to one another. In one example, all or a portion of dies 408(1)-(4) can include and/or represent duplicates and/or copies of one another. For example, dies 408(1)-(4) can constitute and/or represent topologically or electrically identical copies of one another. Additionally or alternatively, dies 408(1)-(4) can be coupled, attached, and/or interfaced with one another via bonds, landing pads (e.g., hybrid-bond landing pads), TSVs, microbumps, and/or die-to-die interconnects.

In some examples, die stack 402 can be incorporated and/or packaged in or as an integrated circuit. For example, die stack 402 can constitute and/or represent a set of dies that include one or more memory and/or cache circuits. Additionally or alternatively, die stack 402 can constitute and/or represent a set of dies that include one or more processor and/or ASIC circuits. In one example, the integrated circuit can include and/or represent one or more semiconductor devices and/or components implemented or deployed as part of a computing system.

In some examples, die stack 402 can be coupled, attached, and/or mounted to a substrate. In one example, all the dies included in die stack 402 can be stacked together using TSVs and then attached to the substrate as a stack. In a further example, a silicon interposer can be attached to the substrate first, after which die stack 402 and/or other components can be attached to the silicon interposer (in, e.g., a "2.5D" and/or "3D" package).

In some examples, signal 106 can be electrically coupled to circuit 104 and/or a circuit 404. For example, die 408(4) can include and/or represent TSV 102 and circuits 104 and 404. In one example, circuit 404 can include and/or represent a tri-state buffer 406 that is electrically coupled to signal 106. Additionally or alternatively, circuit 404 can include and/or represent a portion of a memory device (e.g., a cache device) and/or a receiver. In certain implementations, circuit 404 can include and/or represent certain components and/or features that are susceptible to the antenna effect and/or ESD. Accordingly, circuit 104 can serve and/or function to protect such components and/or features against the antenna effect and/or ESD.

In some examples, the various devices and/or systems described in connection with FIGS. 1-4 can include and/or represent one or more additional circuits, components, and/or features that are not necessarily illustrated and/or labeled in FIGS. 1-4. For example, the apparatuses, implementations, and systems in FIG. 1-4 can also include and/or represent additional computing devices, analog and/or digital circuitry, onboard logic, transmitters, receivers, transceivers, transistors, resistors, capacitors, diodes, multiplexers, inductors, switches, registers, flipflops, connections, traces, buses, semiconductor (e.g., silicon) devices and/or structures, processing devices, storage devices, circuit boards, packages, substrates, housings, combinations or variations of one or more of the same, and/or any other suitable components that facilitate and/or support reducing the footprints of circuits that protect against the antenna effect and ESD. In certain implementations, one or more of these additional circuits, components, devices, and/or features can be inserted and/or applied between any of the existing circuits, components, and/or devices illustrated in FIGS. 1-4 consistent with the aims and/or objectives provided herein. Accordingly, the electrical and/or communicative couplings described with reference to FIGS. 1-4 can be direct connections with no intermediate components, devices, and/or nodes or indirect connections with one or more intermediate components, devices, and/or nodes.

In some examples, the phrase "to couple" and/or the term "coupling," as used herein, can refer to a direct connection and/or an indirect connection. For example, a direct coupling between two components can constitute and/or represent a coupling in which those two components are directly connected to each other by a single node that provides electrical continuity from one of those two components to the other. In other words, the direct coupling can exclude and/or omit any additional components between those two components.

Additionally or alternatively, an indirect coupling between two components can constitute and/or represent a coupling in which those two components are indirectly connected to each other by multiple nodes that fail to provide electrical continuity from one of those two components to the other. In other words, the indirect coupling can include and/or incorporate at least one additional component between those two components.

Figure 5:
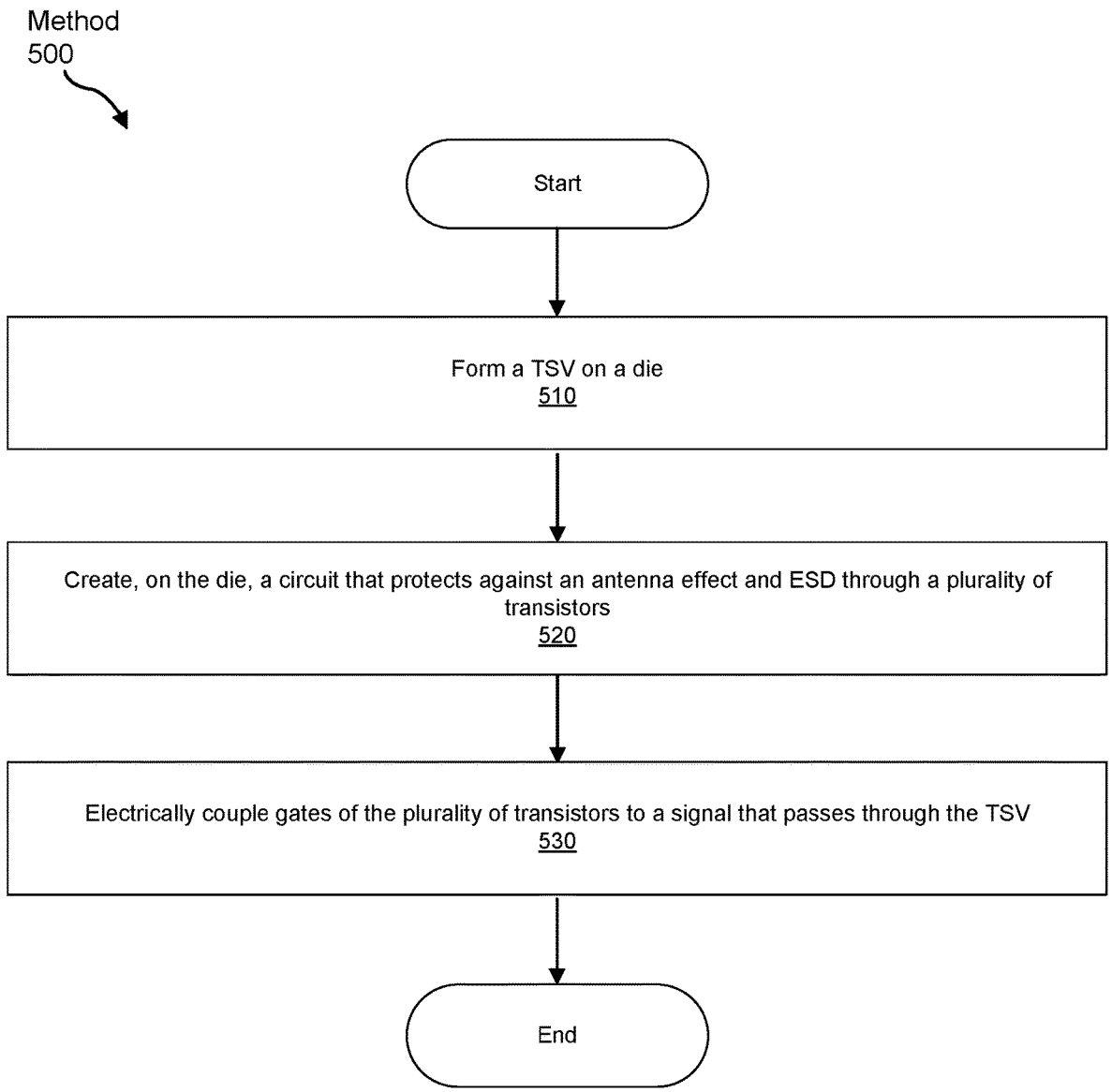
FIG. 5 is a flowchart of an exemplary method for reducing the footprints of circuits that protect against the antenna effect and ESD according to one or more implementations of this disclosure.

FIG. 5 is a flow diagram of an exemplary method 500 for reducing the footprints of circuits that protect against the antenna effect and ESD. In one example, the steps shown in FIG. 5 can be performed and/or executed during the manufacture, creation, and/or assembly of a semiconductor device and/or die. Additionally or alternatively, the steps shown in FIG. 5 can also incorporate and/or involve various sub-steps and/or variations consistent with the descriptions provided above in connection with FIGS. 1-4.

As illustrated in FIG. 5, exemplary method 500 includes and/or involves the step of forming a TSV on a die (510). Step 510 can be performed in a variety of ways, including any of those described above in connection with FIGS. 1-4. For example, a computing equipment manufacturer and/or subcontractor can form, create, and/or construct a TSV on a die.

Exemplary method 500 also includes and/or involves the step of creating, on the die, a circuit that protects against an antenna effect and ESD through a plurality of transistors (520). Step 520 can be performed in a variety of ways, including any of those described above in connection with FIGS. 1-4. For example, a computing equipment manufacturer and/or subcontractor can form, create, and/or configure a circuit on the die. In this example, the circuit can protect against and/or prevent the antenna effect and ESD through a plurality of transistors.

Exemplary method 500 further includes the step of electrically coupling gates of the plurality of transistors to a signal that passes through the TSV (530). Step 530 can be performed in a variety of ways, including any of those described above in connection with FIGS. 1-4. For example, a computing equipment manufacturer and/or subcontractor can electrically couple gates of the plurality of transistors to a signal that passes through the TSV.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality. Furthermore, the various steps, events, and/or features performed by such components should be considered exemplary in nature since many alternatives and/or variations can be implemented to achieve the same functionality within the scope of this disclosure.

The process parameters and sequence of the steps described and/or illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the instant disclosure. The implementations disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a through-silicon via (TSV); and
   a circuit that protects against an antenna effect and electrostatic discharge (ESD), the circuit comprising a plurality of transistors whose gates are each electrically coupled to a signal that passes through the TSV.

2. The apparatus of claim 1, further comprising:
   a plurality of additional TSVs; and
   a plurality of additional circuits that protect against the antenna effect and the ESD, each of the plurality of additional circuits comprising a plurality of additional transistors whose gates are each electrically coupled to an additional signal that passes through at least one of the plurality of additional TSVs.

3. The apparatus of claim 1, wherein the plurality of transistors comprises:
   a first transistor whose terminals are collectively coupled to the signal and a positive supply voltage;
   a second transistor whose terminals are collectively coupled to the signal and a negative supply voltage or an electrical ground; and
   a third transistor whose terminals are collectively coupled to the signal and the negative supply voltage or the electrical ground.

4. The apparatus of claim 1, wherein the plurality of transistors comprises a set of three field-effect transistors (FETs) whose gates are each directly electrically coupled to the signal.

5. The apparatus of claim 4, wherein the set of three FETs comprises:
   a p-channel metal-oxide-semiconductor FET (MOSFET) whose gate, source, and drain are each electrically coupled to the signal and whose bulk is electrically coupled to a positive supply voltage;
   a first n-channel MOSFET whose gate, source, and drain are each electrically coupled to the signal and whose bulk is electrically coupled to a negative supply voltage or an electrical ground; and
   a second n-channel MOSFET whose gate, source, and drain are each electrically coupled to the signal and whose bulk is electrically coupled to the negative supply voltage or the electrical ground.

6. The apparatus of claim 1, further comprising a very large scale integration (VLSI) device that includes the TSV and the circuit.

7. The apparatus of claim 6, wherein:
   the VLSI device comprises a plurality of standard cells that share one or more dimensions in common with one another; and
   the circuit fits inside a standard cell included in the plurality of standard cells.

8. The apparatus of claim 1, further comprising an additional circuit electrically coupled to the signal.

9. The apparatus of claim 8, wherein the additional circuit comprises a tri-state buffer electrically coupled to the signal.

10. The apparatus of claim 8, wherein the additional circuit comprises at least a portion of a memory device.

11. A system comprising:
    a through-silicon via (TSV); and
    a plurality of dies electrically coupled to one another by the TSV, the plurality of dies comprising a die that implements a circuit that:
    protects against an antenna effect and electrostatic discharge (ESD); and
    includes a plurality of transistors whose gates are each electrically coupled to a signal that passes through the TSV.

12. The system of claim 11, further comprising a plurality of additional TSVs, wherein the die further implements a plurality of additional circuits that protect against the antenna effect and the ESD, each of the plurality of additional circuits comprising a plurality of additional transistors whose gates are each electrically coupled to an additional signal that passes through at least one of the plurality of additional TSVs.

13. The system of claim 11, wherein the plurality of transistors comprises:
    a first transistor whose terminals are collectively coupled to the signal and a positive supply voltage;
    a second transistor whose terminals are collectively coupled to the signal and a negative supply voltage or an electrical ground; and
    a third transistor whose terminals are collectively coupled to the signal and the negative supply voltage or the electrical ground.

14. The system of claim 11, wherein the plurality of transistors comprises a set of three field-effect transistors (FETs) whose gates are each electrically coupled to the signal.

15. The system of claim 14, wherein the set of three FETs comprises:
- a p-channel metal-oxide-semiconductor FET (MOSFET) whose gate, source, and drain are each electrically coupled to the signal and whose bulk is electrically coupled to a positive supply voltage;
- a first n-channel MOSFET whose gate, source, and drain are each electrically coupled to the signal and whose bulk is electrically coupled to a negative supply voltage or an electrical ground; and
- a second n-channel MOSFET whose gate, source, and drain are each electrically coupled to the signal and whose bulk is electrically coupled to the negative supply voltage or the electrical ground.

16. The system of claim 11, further comprising a very large scale integration (VLSI) device that includes the TSV and the plurality of dies.

17. The system of claim 16, wherein:
- the VLSI device comprises a plurality of standard cells that share one or more dimensions in common with one another; and
- the circuit fits inside a standard cell included in the plurality of standard cells.

18. The system of claim 11, further comprising an additional circuit electrically coupled to the signal.

19. The system of claim 18, wherein the additional circuit comprises a tri-state buffer electrically coupled to the signal.

20. A method comprising:
- forming a through-silicon via (TSV) on a die;
- creating, on the die, a circuit that protects against an antenna effect and electrostatic discharge (ESD) through a plurality of transistors; and
- electrically coupling gates of the plurality of transistors to a signal that passes through the TSV.

\* \* \* \* \*